US006863927B2

(12) United States Patent
Langley et al.

(10) Patent No.: US 6,863,927 B2
(45) Date of Patent: Mar. 8, 2005

(54) METHOD FOR VAPOR PHASE ALUMINIDING OF A GAS TURBINE BLADE PARTIALLY MASKED WITH A MASKING ENCLOSURE

(75) Inventors: Nigel Brian Thomas Langley, Danvers, MA (US); Kwok Heng Yow, Singapore (SG)

(73) Assignee: General Electric Aviation Service Operation Ptd. Ltd., Singapore (SG)

( * ) Notice: Subject to any disclaimer, the term of this patent is extended or adjusted under 35 U.S.C. 154(b) by 264 days.

(21) Appl. No.: 10/259,342

(22) Filed: Sep. 27, 2002

(65) Prior Publication Data

US 2004/0062864 A1 Apr. 1, 2004

(51) Int. Cl.[7] .................................................. C23C 16/04
(52) U.S. Cl. ........................ 427/252; 427/253; 427/282
(58) Field of Search ................................ 427/252, 253, 427/282

(56) References Cited

U.S. PATENT DOCUMENTS 4,271,005 A 6/1981 Wright et al.
4,291,448 A 9/1981 Cretella et al.
4,530,861 A 7/1985 Sippel et al.
4,617,202 A 10/1986 Baldi
5,225,246 A 7/1993 Beers et al.
5,792,267 A 8/1998 Marszal et al.
6,224,673 B1 5/2001 Das et al.
6,296,705 B1 10/2001 Ireland et al.
6,332,926 B1 12/2001 Pfaendtner et al.
6,391,115 B1 * 5/2002 Marszal et al. ............. 118/721

* cited by examiner

*Primary Examiner*—Timothy Meeks
(74) *Attorney, Agent, or Firm*—Gregory O. Garmong; Carmen Santa Maria; McNees Wallace & Nurick LLC

(57) ABSTRACT

A gas turbine blade to be protected by an aluminide coating is placed within a masking enclosure including an airfoil enclosure that prevents deposition on the airfoil of the gas turbine blade, and a dovetail enclosure that prevents deposition on the dovetail of the gas turbine blade. The assembly is vapor phase aluminided such that aluminum is deposited on an exposed portion of the gas turbine blade that is not within the masking enclosure.

17 Claims, 2 Drawing Sheets

METHOD FOR VAPOR PHASE ALUMINIDING OF A GAS TURBINE BLADE PARTIALLY MASKED WITH A MASKING ENCLOSURE

This invention relates to the gas turbine blades used in gas turbine engines and, more particularly, to selectively protecting portions of the gas turbine blades with a protective coating.

BACKGROUND OF THE INVENTION

In an aircraft gas turbine (jet) engine, air is drawn into the front of the engine, compressed by a shaft-mounted compressor, and mixed with fuel. The mixture is burned, and the hot combustion gases are passed through a turbine mounted on the same shaft. The flow of combustion gas turns the turbine by impingement against an airfoil section of the turbine blades and vanes, which turns the shaft and provides power to the compressor. The hot exhaust gases flow from the back of the engine, driving it and the aircraft forward.

The hotter the combustion and exhaust gases, the more efficient is the operation of the jet engine. There is thus an incentive to raise the combustion and exhaust gas temperatures. The maximum temperature of the combustion gases is normally limited by the materials used to fabricate the hot-section components of the engine. These components include the turbine vanes and turbine blades of the gas turbine, upon which the hot combustion gases directly impinge. In current engines, the turbine vanes and blades are made of nickel-based superalloys, and can operate at temperatures of up to about 1800–2100° F. These components are subject to damage by oxidation and corrosive agents.

Many approaches have been used to increase the operating temperature limits and service lives of the turbine blades and vanes to their current levels, while achieving acceptable oxidation and corrosion resistance. The composition and processing of the base materials themselves have been improved. Cooling techniques are used, as for example by providing the component with internal cooling passages through which cooling air is flowed.

In another approach used to protect the hot-section components, a portion of the surfaces of the turbine blades is coated with a protective coating. One type of protective coating includes an aluminum-containing protective coating deposited upon the substrate material to be protected. The exposed surface of the aluminum-containing protective coating oxidizes to produce an aluminum oxide protective layer that protects the underlying substrate.

Different portions of the gas turbine blade require different types and thicknesses of protective coatings, and some portions require that there be no coating thereon. The application of the different types and thicknesses of protective coatings in some regions, and the prevention of coating deposition in other regions, while using the most cost-efficient coating techniques, can pose difficult problems for gas turbine blades which are new-make or are undergoing repair, and may have existing coatings thereon and/or may need new coatings applied. In many cases, it is difficult to achieve the desired combination of protective coatings and bare surfaces. There is a need for an improved approach to such coating processes to achieve the required selectivity in the presence and thickness of the protective coating in some regions, and to ensure its absence in other regions. The present invention fulfills this need, and further provides related advantages.

BRIEF SUMMARY OF THE INVENTION

The present invention provides a method for selectively protecting a gas turbine blade by depositing coatings of a desired type and thickness in some regions, and preventing the coating in other regions. The approach uses vapor phase aluminiding, a coating technique that is relatively economical and environmentally acceptable as compared with alternative approaches such as pack aluminiding. Transition zones between the coated and uncoated regions of no more than about ⅛ inch may be achieved.

A method for selectively protecting a gas turbine blade comprises the steps of providing the gas turbine blade having an airfoil, a shank with a dovetail, and a platform therebetween having a top surface and a bottom surface, and providing a masking enclosure. The masking enclosure includes an airfoil enclosure having a top seal plate with a top opening therethrough and sized to receive the airfoil of the gas turbine blade therein with the airfoil extending through the top opening and the top seal plate contacting the top surface of the platform. The masking enclosure further includes a dovetail enclosure including a dovetail guide that receives a lower end of the dovetail therein and a bottom seal plate with a bottom opening therethrough and sized to fit around the shank. The gas turbine blade is placed into the masking enclosure to form an aluminiding assembly. The aluminiding assembly with the gas turbine blade having its airfoil and its dovetail within the masking enclosure is vapor-phase aluminided, such that aluminum is deposited on an exposed portion of the gas turbine blade that is not within the masking enclosure.

In an application of interest, the gas turbine has previously been in service, and it is cleaned prior to placing it into the masking enclosure.

The top opening of the airfoil enclosure is desirably sized so that a top gap between the airfoil and the top opening is not greater than about 0.005 inch. Similarly, the bottom opening is desirably sized so that a bottom gap between the shank and the bottom opening is not greater than about 0.001 inch. This close fit between the openings and the respective portions of the turbine blade aids in preventing penetration of the aluminum-containing gas during the aluminiding step. Additionally, the top opening may be profiled to conform to a shape of the airfoil adjacent to the platform. A space between the dovetail and the dovetail enclosure may be filled with a masking powder to reduce the possibility that the aluminiding gas may penetrate through the gap between the shank and the bottom opening.

To prevent loss of aluminum from the airfoil in those situations where it has been previously aluminiding, an aluminum-containing coating may be deposited on an inside surface of the airfoil enclosure.

Preferably, the airfoil enclosure is not integral with the dovetail enclosure. The dovetail enclosure usually has a removable end plate sized to allow placing of the dovetail within the dovetail enclosure.

The vapor phase aluminiding may be conducted by any operable approach. Preferably, the aluminiding assembly is vapor phase aluminided from a solid aluminum source that is not in physical contact with the aluminiding assembly.

Vapor phase aluminiding is an efficient, fast, environmentally friendly approach for depositing an aluminum-containing layer in the thicknesses required for gas turbine protective coatings. However, it is difficult to selectively and precisely deposit the aluminum on only those regions of the gas turbine blade where it is required, without depositing it on other portions, such as the dovetail, where its presence is not permitted. Many masking techniques have been used, but the available techniques do not provide a sufficiently good definition of the masked from the unmasked regions because the aluminum-containing vapor is so mobile that it penetrates through or around most masks. As a result, the aluminum-containing coating is often present on the portions that are not to be coated, when prior approaches are used. In the present case, the closely fitting masking enclosure, coupled with the other masking techniques discussed herein, are highly successful in defining the dividing line between the coated and the uncoated regions. In testing, a coating-to-no-coating transition of no more than about ⅛ inch has been achieved. This good resolution of the coating-to-no-coating transition is particularly important for small gas turbine blades, often no more than about 2 inches in total length. Additionally, the reusable masking enclosure is very cost effective to use, as compared with more complex one-time masking techniques such as tape, slurry, or powder masks. Production efficiency with the present approach may be improved even further by building the masking enclosure so that two or more gas turbine blades may be placed into the masking enclosure.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
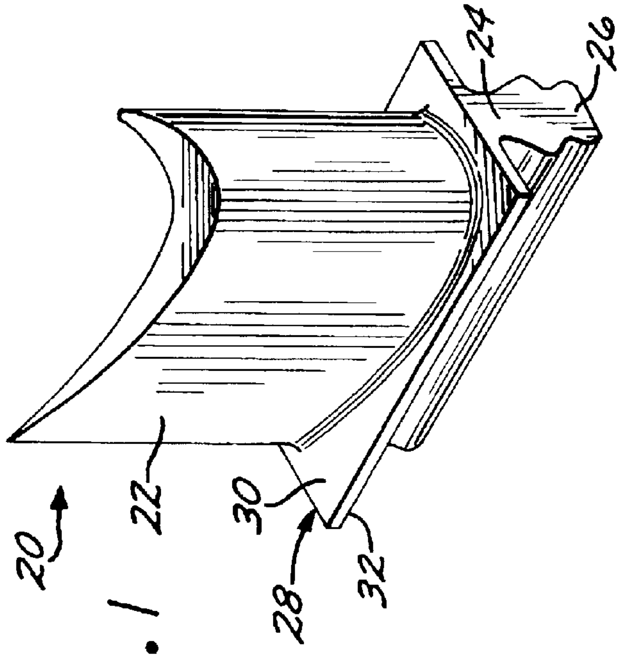
FIG. 1 is a perspective view of a gas turbine blade.

FIG. 1 depicts a gas turbine blade 20 which has preferably previously been in service, or which may be a new-make article. The gas turbine blade 20 has an airfoil 22 against which the flow of hot combustion gas impinges during service operation, a downwardly extending shank 24, and an attachment in the form of a dovetail 26 which attaches the gas turbine blade 20 to a gas turbine disk (not shown) of the gas turbine engine. A platform 28 extends transversely outwardly at a location between the airfoil 22 and the shank 24 and dovetail 26. The platform 28 has a top surface 30 adjacent to the airfoil 22, and a bottom surface 32 (sometimes termed an "underside" of the platform) adjacent to the shank 24 and the dovetail 26. An example of a gas turbine blade 20 with which the present approach may be used is the CF34-3B1 high pressure turbine blade, although the invention is not so limited.

The entire gas turbine blade 20 is preferably made of a nickel-base superalloy. A nickel-base alloy has more nickel than any other element, and a nickel-base superalloy is a nickel-base alloy that is strengthened by gamma-prime phase or a related phase. An example of a nickel-base superalloy with which the present invention may be used is Rene$^{R}$ 142, having a nominal composition in weight percent of about 12.0 percent cobalt, about 6.8 percent chromium, about 1.5 percent molybdenum, about 4.9 percent tungsten, about 2.8 percent rhenium, about 6.35 percent tantalum, about 6.15 percent aluminum, about 1.5 percent hafnium, about 0.12 percent carbon, about 0.015 percent boron, balance nickel and minor elements, but the use of the invention is not so limited.

The preferred embodiment is utilized in relation to the gas turbine blade 20 which has previously been in service, and that embodiment will be described although the invention may be used as well in relation to new-make articles. The gas turbine blade 20, which has previously been in service, is manufactured as a new-make gas turbine blade, and then used in aircraft-engine service at least once. During service, the gas turbine blade 20 is subjected to conditions which degrade its structure. Portions of the gas turbine blade are eroded, oxidized, and/or corroded away so that its shape and dimensions change, and coatings are pitted or depleted. Because the gas turbine blade 20 is an expensive article, it is preferred that relatively minor damage be repaired, rather than scrapping the gas turbine blade 20. The present approach is provided to repair, refurbish, and rejuvenate the gas turbine blade 20 so that it may be returned to service. Such repair, refurbishment, and rejuvenation is an important function which improves the economic viability of aircraft gas turbine engines by returning otherwise-unusable gas turbine blades to subsequent service after appropriate processing.

One aspect of the repair in some cases is to apply a protective coating to the bottom surface 32 of the platform 28 and the adjacent portion of the shank 24. Because the bottom surface 32 of the platform 28 and the shank 24 are relatively isolated from the flow of hot combustion gas that impinges against the airfoil 22, it has been customary in the past that they not be provided with a protective coating. However, as other properties of the gas turbine blade 20 have been improved to allow ever-hotter operating temperatures for increased engine efficiency, it has become apparent that the bottom surface 32 of the platform 28 and the adjacent portion of the shank 24 of the gas turbine blades 20 of advanced engines may require protective coatings to inhibit and desirably avoid damage from oxidation and corrosion. The present invention as applied to gas turbine blades that have been previously in service is addressed to the circumstance where it becomes apparent that such a protective coating is required on the bottom surface 32 of the platform 28 and to the adjacent portion of the shank 24 only after the gas turbine blade 20 has been in service. Similar considerations apply to new-make gas turbine blades, if the need for the protective coating is known during the initial manufacturing process.

Figure 2:
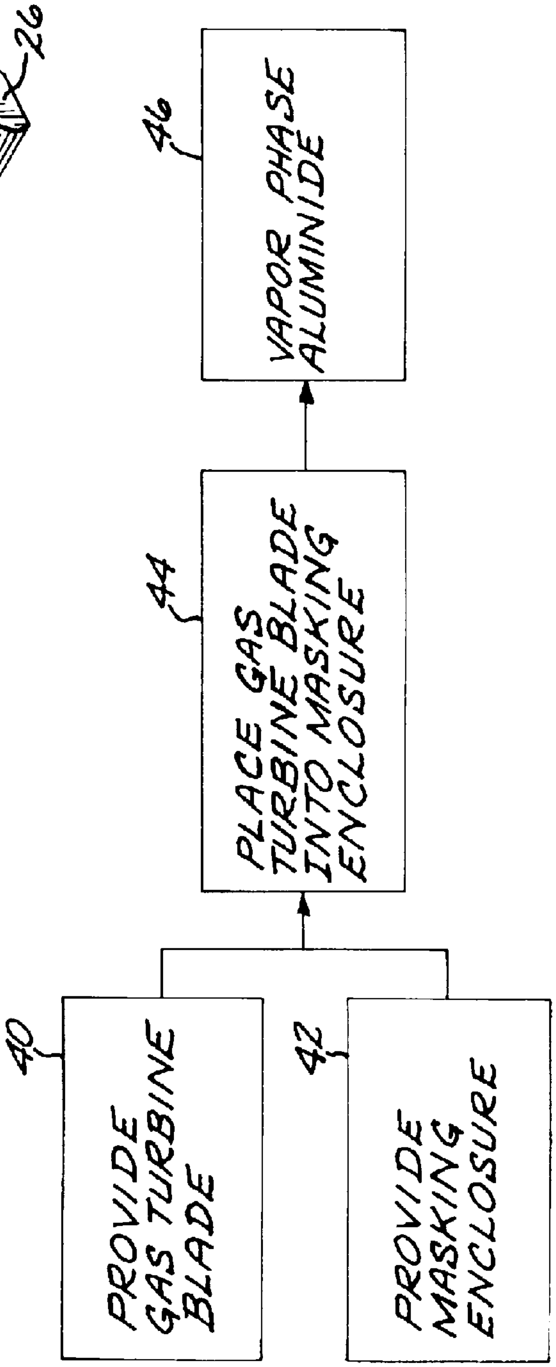
FIG. 2 is a block flow diagram of a method for selectively protecting the gas turbine blade.

FIG. 2 illustrates a preferred approach for practicing the invention. The gas turbine blade 20 as described above is provided, step 40. If the gas turbine blade 20 has been in service, it is cleaned as part of the providing step 40. The cleaning normally involves the removal of surface dirt, soot, oxides, and corrosion products from at least the regions that are to be coated in the present operation, specifically the bottom surface 32 of the platform 28 and the adjacent portion of the shank 24. The remainder of the gas turbine blade 20 is also typically cleaned as well. Any operable cleaning procedure may be used. One effective approach is to contact the turbine blade 20 to a weak acid bath, such as diammonium versene, and thereafter to grit blast the turbine blade 20.

Figure 4:
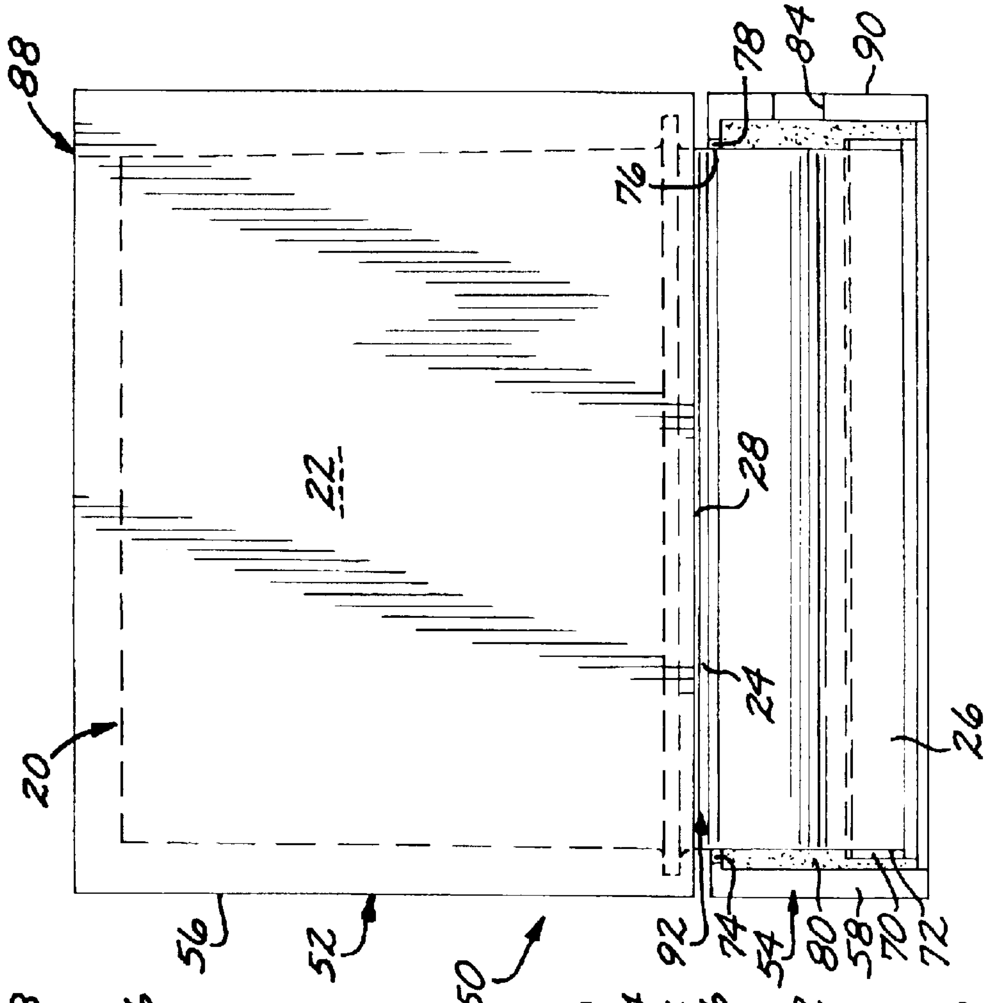
FIG. 4 is a schematic sectional side view of the gas turbine blade in the masking enclosure.
Figure 3:
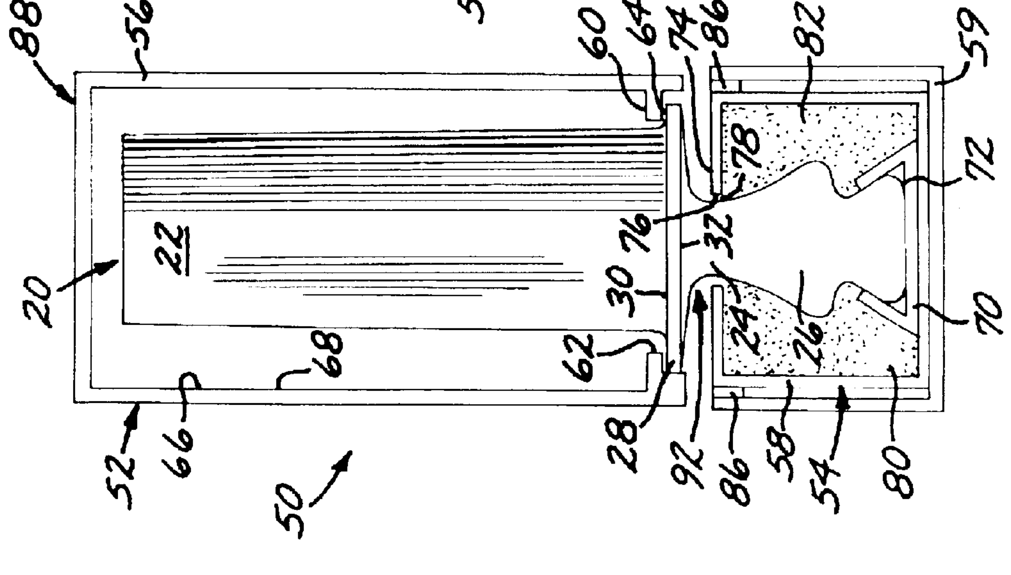
FIG. 3 is a schematic sectional end view of the gas turbine blade in the masking enclosure.

A masking enclosure 50, illustrated in FIGS. 3–4 with the gas turbine blade 20 therein, is provided, numeral 42. The masking enclosure 50 comprises two parts, an airfoil enclosure 52 and a dovetail enclosure 54, which are preferably not integral with each other. The airfoil enclosure 52 and the dovetail enclosure 54 are boxes with solid walls and openings therethrough as will be described subsequently. The function of the masking enclosure 50 is to prevent aluminum deposition on the enclosed portions and to permit aluminum deposition on the unenclosed portions during the aluminiding process. The respective walls 56 and 58 of the enclosures 52 and 54 may be made of any operable material that will not significantly degrade when exposed to the elevated temperature conditions of the aluminiding process, and are preferably a nickel-base alloy which will not release particles onto the gas turbine blade 20 that is being processed. An example of such a nickel-base alloy is $Rene_R$ 142.

The dovetail enclosure 54 is typically supported in a boxlike holder 59, shown in FIG. 3 but omitted from FIG. 4 for clarity. Wedges 86 may be placed between the wall 58 of the dovetail enclosure 54 and the wall of the holder 59 to precisely position the dovetail enclosure 54 and to prevent it from tipping.

The airfoil enclosure 52 has a top seal plate 60 with a top opening 62 therethrough. The top opening 62 is shaped and sized to receive the airfoil 22 of the gas turbine blade 20 therethrough, with the airfoil 22 extending through the top opening 62 and into the interior of the airfoil enclosure 52. The top seal plate 60 preferably contacts and rests upon the top surface 30 of the platform 28 with a close contact therebetween. The top opening 62 is preferably shaped, sized, and dimensioned so that a top gap 64 between the airfoil 22 and the top opening 62 is not greater than about 0.005 inch, so that aluminiding gas cannot readily flow into the interior of the airfoil enclosure 52. To further prevent any such flow of aluminiding gas into the interior of the airfoil enclosure 52, the top seal plate 60 is desirably made with the top opening 62 shaped to conform to a shape of the portion of the airfoil 22 which is adjacent to the platform 28.

An inside surface 66 of the wall 56 of the airfoil enclosure 52 is preferably coated with a thin aluminum-containing coating 68. The aluminum-containing coating 68 prevents the depletion of aluminum from coatings that are already present on the surface of the airfoil 22 within the airfoil enclosure 52 during the subsequent heating associated with aluminiding.

The dovetail enclosure 54 further includes a dovetail guide 70 in the form of a slot that receives a lower end 72 of the dovetail 28 therein. The dovetail guide 70 holds the dovetail 26, and thence the entire gas turbine blade 20, in the proper orientation relative to the dovetail enclosure 54 and the airfoil enclosure 52. The function of the dovetail enclosure 54 is to prevent deposition of aluminum onto the dovetail 26 during the subsequent vapor phase aluminiding step. A bottom seal plate 74 has a bottom opening 76 therethrough shaped and sized to fit around the adjacent portion of the shank 24.

The bottom opening is 76 shaped and sized so that a bottom gap 78 between the shank 24 and the bottom opening 76 is not greater than about 0.001 inch, to minimize the penetration of the aluminiding gas into the interior of the dovetail enclosure 54 during the subsequent aluminiding step. Additionally, a space 80 between the dovetail 26 and the wall 58 of the dovetail enclosure 54 may optionally be filled with a masking powder 82 that is filled through a fill-hole 84 (which is thereafter plugged) in the wall 58 of the dovetail enclosure 54. The masking powder 82 is preferably an inert substance such as alumina.

The gas turbine blade 20 is placed, numeral 44, into the masking enclosure 50, to form an aluminiding assembly 88 as seen in FIGS. 3–4. To achieve this assembly, the gas turbine blade 20 is first inserted into the dovetail enclosure 54. To permit the insertion of the gas turbine blade into the dovetail enclosure 54, the dovetail enclosure 54 is preferably provided with a removable end plate 90. The dovetail 26 slides into the dovetail guide 70 with the end plate 90 removed, and then the end plate 90 is installed. The airfoil enclosure 52 is installed over the airfoil 22. The aluminiding assembly 88 has the airfoil 22 and the dovetail 26 of the gas turbine blade 20 within the masking enclosure 50.

The aluminiding assembly 88 is vapor phase aluminided, step 46, preferably from a solid aluminum-containing source that is not in physical contact with the aluminiding assembly 88. Aluminum is deposited on an exposed portion 92 of the gas turbine blade 20 that is not within the masking enclosure 50. In the illustrated embodiment, the exposed portion 92 includes the bottom surface 32 of the platform 28 and the adjacent portion of the shank 24 between the platform 28 and the dovetail 26 although the invention is not so limited.

Vapor phase aluminiding is a known procedure in the art, and any form of vapor phase aluminiding may be used. In its preferred form, baskets of chromium-aluminum alloy pellets are positioned within about 1 inch of the gas turbine blade to be vapor phase aluminided, in a retort. The retort containing the baskets and the turbine blade 20 (typically many turbine blades are processed together) is heated in an argon atmosphere at a heating rate of about 50° F. per minute to a temperature of about 1975° F.+/−25° F., held at that temperature for about 3 hours+/−15 minutes, during which time aluminum is deposited, and then slow cooled to about 250° F. and thence to room temperature. These times and temperatures may be varied to alter the thickness of the deposited aluminum-containing layer.

The present invention has beer reduced to practice with gas turbine blades that are about 1.8 inches long, using the approach discussed above. The transition between the exposed portion 92 of the gas turbine blade that was aluminided and the dovetail 26 that was not to be aluminided was only about ⅛ inch, providing a precisely controlled dividing line.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for selectively protecting a gas turbine blade, comprising the steps of providing the gas turbine blade having an airfoil, a shank with a dovetail, and a platform therebetween having a top surface and a bottom surface;

providing a masking enclosure comprising an airfoil enclosure having a top seal plate with a top opening therethrough and sized to receive the airfoil of the gas turbine blade therein with the airfoil extending through the top opening and the top seal plate contacting the top surface of the platform, and a dovetail enclosure including a dovetail guide that receives a lower end of the dovetail therein and a bottom seal plate with a bottom opening therethrough and sized to fit around the shank; thereafter placing the gas turbine blade into the masking enclosure to form an aluminiding assembly; and thereafter vapor phase aluminiding the aluminiding assembly with the gas turbine blade having its airfoil and its dovetail within the masking enclosure, such that aluminum is deposited on an exposed portion of the gas turbine blade that is not within the masking enclosure.

2. The method of claim 1, wherein the step of providing the gas turbine blade includes the steps of providing the gas turbine blade which has previously been in service, and cleaning the gas turbine blade.

3. The method of claim 1, wherein the step of providing the masking enclosure includes the step of depositing an aluminum-containing coating on an inside surface of the airfoil enclosure.

4. The method of claim 1, wherein the step of providing the masking enclosure includes the step of sizing the top opening so that a top gap between the airfoil and the top opening is not greater than about 0.005 inch.

5. The method of claim 1, wherein the step of providing the masking enclosure includes the step of providing the top seal plate with the top opening profiled to conform to a shape of the airfoil adjacent to the platform.

6. The method of claim 1, wherein the step of providing the masking enclosure includes the step of sizing the bottom opening so that a bottom gap between the shank and the bottom opening is not greater than about 0.001 inch.

7. The method of claim 1, wherein the step of providing the masking enclosure includes the step of providing the airfoil enclosure that is not integral with the dovetail enclosure.

8. The method of claim 1, wherein the step of providing the masking enclosure includes the step of providing the dovetail enclosure with a removable end plate sized to allow placing of the dovetail within the dovetail enclosure.

9. The method of claim 1, wherein the step of placing includes a step of filling a space between the dovetail and the dovetail enclosure with a masking powder.

10. The method of claim 1, wherein the step of vapor phase aluminiding includes the step of vapor phase aluminiding the aluminiding assembly from a solid aluminum source that is not in physical contact with the aluminiding assembly.

11. A method for selectively protecting a gas turbine blade, comprising the steps of providing the gas turbine blade which has previously been in service and having an airfoil, a shank with a dovetail, and a platform therebetween having a top surface and a bottom surface, wherein the step of providing the gas turbine blade includes the step of cleaning the gas turbine blade;

providing a masking enclosure comprising an airfoil enclosure having a top seal plate with a top opening therethrough and sized to receive the airfoil of the gas turbine blade therein with the airfoil extending through the top opening and the top seal plate contacting the top surface of the platform, wherein the step of providing the masking enclosure includes the step of depositing an aluminum-containing coating on an inside surface of the airfoil enclosure, and a dovetail enclosure including a dovetail guide that receives a lower end of the dovetail therein and a bottom seal plate with a bottom opening therethrough and sized to fit around the shank; thereafter placing the gas turbine blade into the masking enclosure to form an aluminiding assembly, wherein the step of placing includes a step of filling a space between the dovetail and the dovetail enclosure with a masking powder; and thereafter vapor phase aluminiding the aluminiding assembly with the gas turbine blade having its airfoil and its dovetail within the masking enclosure, such that aluminum is deposited on an exposed portion of the gas turbine blade that is not within the masking enclosure.

12. The method of claim 11, wherein the step of providing the masking enclosure includes the step of sizing the top opening so that a top gap between the airfoil and the top opening is not greater than about 0.005 inch.

13. The method of claim 11, wherein the step of providing the masking enclosure includes the step of providing the top seal plate with the top opening profiled to conform to a shape of the airfoil adjacent to the platform.

14. The method of claim 11, wherein the step of providing the masking enclosure includes the step of sizing the bottom opening so that a bottom gap between the shank and the bottom opening is not greater than about 0.001 inch.

15. The method of claim 11, wherein the step of providing the masking enclosure includes the step of providing the airfoil enclosure that is not integral with the dovetail enclosure.

16. The method of claim 11, wherein the step of providing the masking enclosure includes the step of providing the dovetail enclosure with a removable end plate sized to allow placing of the dovetail within the dovetail enclosure.

17. The method of claim 11, wherein the step of vapor phase aluminiding includes the step of vapor phase aluminiding the aluminiding assembly from a solid aluminum source that is not in physical contact with the aluminiding assembly.

* * * * *